United States Patent
Tanaka

(10) Patent No.: US 6,467,071 B2
(45) Date of Patent: Oct. 15, 2002

(54) SHIELD CIRCUIT DESIGNING APPARATUS AND SHIELD CIRCUIT DESIGNING METHOD

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 80 days.

(21) Appl. No.: 09/759,262

(22) Filed: Jan. 16, 2001

(65) Prior Publication Data

US 2002/0074671 A1 Jun. 20, 2002

(30) Foreign Application Priority Data

Jul. 27, 2000 (JP) ........................................ 2000-227759

(51) Int. Cl.⁷ ............................................. G06F 17/50
(52) U.S. Cl. ............................................. 716/10; 716/1
(58) Field of Search ........................ 716/1–18; 365/102, 365/206, 51; 326/15

(56) References Cited

U.S. PATENT DOCUMENTS 5,563,820 A * 10/1996 Wada et al. ............... 365/206
6,285,573 B1 * 9/2001 Park .......................... 365/102

FOREIGN PATENT DOCUMENTS

| JP | 404073951 A | * 3/1992 | ........... H01L/21/82 |
| JP | 404170049 A | * 6/1992 | ........... H01L/21/82 |
| JP | 6-314741    | 11/1994  |                       |
| JP | 08306867 A  | * 11/1996| ........... H01L/27/04|
| JP | 9-307061    | 11/1997  |                       |
| JP | 11-40699    | 2/1999   |                       |

OTHER PUBLICATIONS

U.S. application No. 09/759,448, Genichi Tanaka, filed Jan. 16, 2001.

* cited by examiner

Primary Examiner—Vuthe Siek
Assistant Examiner—Sun James Lin
(74) Attorney, Agent, or Firm—Burns, Doane, Swecker & Mathis, LLP

(57) ABSTRACT

A cell selecting and connecting unit selects a type of cell adapted to drive a shield wire with a logical value corresponding to a logical value of at least one of inputs to a cell that drives a target wire that requires shielding. The cell selecting and connecting unit connects a cell of a selected type to the cell that drives the target wire so that an additional cell placing unit places the cell of the selected type. A shield generating unit generates a shielding wire connected to the placed cell along the target wire.

14 Claims, 5 Drawing Sheets

SHIELD CIRCUIT DESIGNING APPARATUS AND SHIELD CIRCUIT DESIGNING METHOD

BACKGROUND OF THE INVENTION

1. Field of the Invention

The present invention relates to a shield circuit designing apparatus and a shield circuit designing method for designing a shield circuit adapted to shield a wire in an integrated circuit.

2. Description of the Related Art

For example, Japanese Laid-Open Patent Application No. 6-314741 discloses a shield circuit designing method according to the related art. A circuit designer specifies a target wire subject to shielding. The target wire and a shielding wire for shielding the target wire are fabricated as a unit such that the shielding wire is connected to a predetermined, constant voltage.

According to the related-art shield circuit designing method as described above, a shield circuit connected to a predetermined, constant voltage can be designed efficiently. However, such a method has a drawback in that a shield circuit in which a shielding wire is driven by a cell cannot be designed easily.

SUMMARY OF THE INVENTION

Accordingly, a general object of the present invention is to provide a shield circuit designing apparatus and a shield circuit designing method in which the aforementioned drawback is eliminated.

Another and more specific object is to provide a shield circuit designing apparatus and a shield circuit designing method capable of efficiently designing a shield circuit in which a shielding wire is driven by a cell, by duplicating and placing cells that drive a specified wire and generating shielding wires connected to the duplicate cells along the specified wire.

Still another and more specific object is to provide a shield circuit designing apparatus and a shield circuit designing method The aforementioned objects can be achieved a shield circuit designing apparatus for designing a shield circuit for shielding a target wire that requires shielding; cell duplicating and placement means for duplicating a cell that drives the target wire, and for placing duplicate cells; and shield generating means for generating shielding wires connected to the duplicate cells placed by the cell duplicating and placement means, along the target wire.

The cell duplicating and placement means may place the cells having a lower driving capability than the cell that drives the target wire.

The aforementioned can also be achieved by a shield circuit designing apparatus for designing a shield circuit for shielding a target wire that requires shielding, comprising: cell selecting and connecting means for selecting a type of cell adapted to drive shielding wires with a logical value corresponding to a logical value of at least one of inputs to a cell that drives the target wire, and for connecting cells of the selected type to the cell that drives the target wire; additional cell placement means for placing the cells connected by the cell selecting and connecting means; and shield generating-means for generating the shielding wires connected to the cells connected by the cell selecting and connecting means, along the target wire.

The cell selecting and connecting means may select one of an inverter and a buffer.

The cell selecting and connecting means may connect a first cell for driving a first shielding wire and a second cell for driving a second shielding wire in series, and the shield generating means may generate the first and second shielding wires along the target wire.

The cell selecting and connecting means may connect a first cell for driving a first individual shielding wire parallel to a second cell for driving a second individual shielding wire, the first and second individual wring constituting the shielding wire, and the shield generating means may generate the first and second individual wires along the target wire.

The cell selecting and connecting means may select a type of cell having a lower driving capability than the cell that drives the target wire.

The aforementioned objects can also be achieved by a shield circuit designing method for designing a shield circuit for shielding a target wire that requires shielding, comprising the steps of: duplicating a cell that drives a target wire and placing resultant duplicate cells to drive respective shielding wires; and generating the shielding wires connected to the duplicate cells along the target wire.

The cells that drive the shielding wires may have a lower driving capability than the cell that drives the target wire.

The aforementioned objects can also be achieved by a shield circuit designing method for designing a shield circuit for shielding a wire, comprising the steps of: selecting a type of cell adapted to drive shielding wires with a logical value corresponding to a logical value of at least one of inputs to a cell that drives the target wire, and connecting cells of the selected type to the cell that drives the target wire; and placing the cells thus connected; and generating the shielding wires connected to the cells thus connected, along the target wire.

One of an inverter and a buffer may be selected as. the type of cell for driving the shielding wires.

A first cell of the selected type for driving a first shielding wire and a second cell of the selected type for driving a second shielding wire may be connected in series, and the first and second shielding wires may be generated along the target wire.

A first cell for driving a first individual shielding wire may be connected parallel to a second cell for driving a second individual shielding wire, the first and second individual wrings constituting the shielding wire, and the first and second individual wires may be generated along the target wire.

The cells that drive the shielding wires may have a lower driving capability than the cell that drives the target wire.

BRIED DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

First Embodiment

Figure 1:
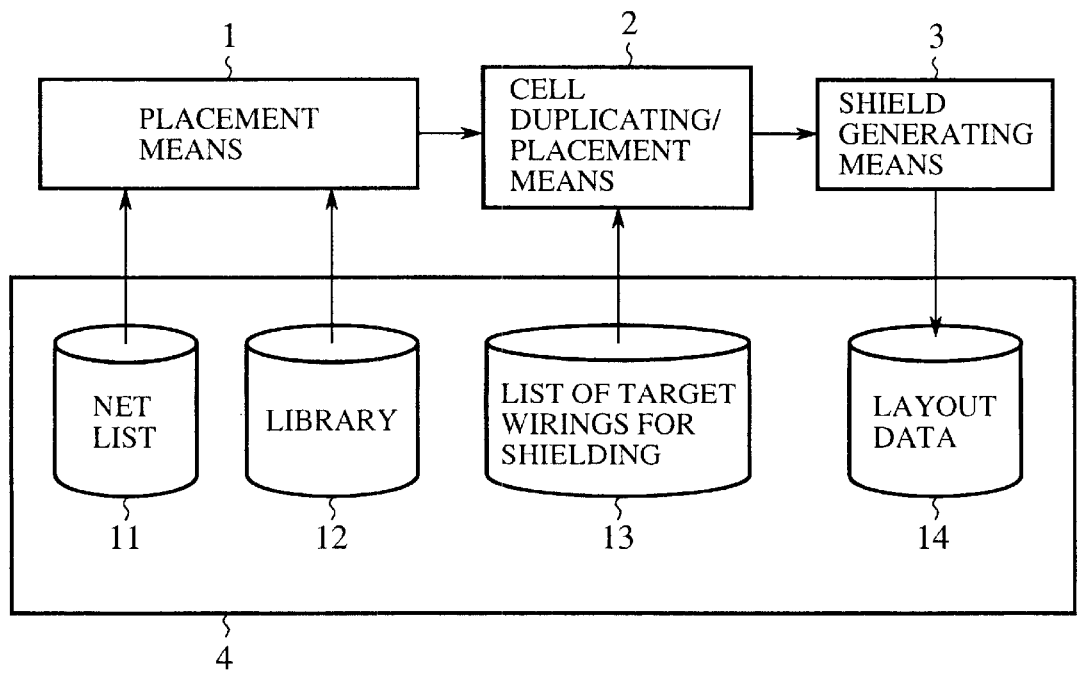
FIG. 1 is a block diagram showing a construction of a shield circuit designing apparatus according to a first embodiment of the present invention.

FIG. 1 is a block diagram showing a construction of a shield circuit designing apparatus according to a first embodiment of the present invention. Referring to FIG. 1, the shield circuit designing apparatus comprises a placement means for determining a layout of an electronic circuit based on a net list 111 and a library 12. Reference numeral 2 indicates a cell duplicating and placement means for duplicating and placing cells for driving a wire specified by a list 13 of target wires subject to shielding. Reference numeral 3 indicates a shield generating means for generating a shielding wire connected to the cells produced by the cell duplicating and placement means 2, along the specified target wire. Reference numeral 4 indicates a storage means such as a memory or a magnetic recording medium.

Reference numeral 11 indicates a net list describing connections in an electronic circuit designed, for example, by a computer aided design (CAD) system. Reference numeral 12 indicates a library containing information related to the layout of cells. Reference numeral 13 indicates a list of target wires subject to shielding specified by a user. Reference numeral 14 indicates layout data in which a shield circuit is added to the electronic circuit originally designed.

The placement means 1, the cell duplicating and placement means 2 and the shield generating means 3 may be implemented by a program listing steps executed by a central processing unit (CPU) and other means.

A description will now be given of an operation according to the first embodiment.

Figure 2:
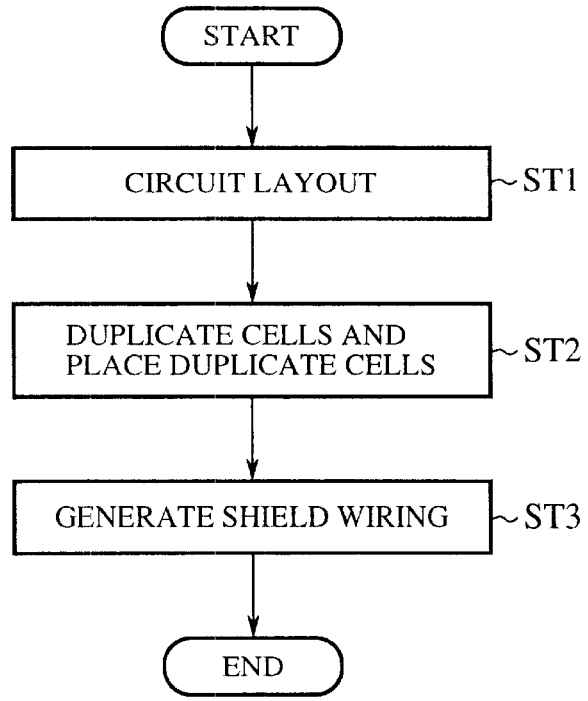
FIG. 2 is a flowchart showing an operation of the shield circuit designing apparatus according to the first embodiment.
Figure 3:
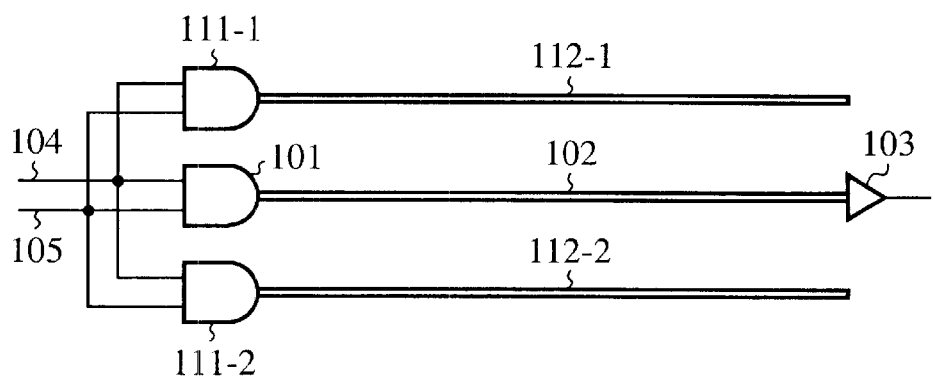
FIG. 3 is a circuit diagram of a shield circuit designed by the shield circuit designing apparatus according to the first embodiment.

FIG. 2 is a flowchart showing an operation of the shield circuit designing apparatus according to the first embodiment. FIG. 3 is a circuit diagram of a shield circuit designed by the shield circuit designing apparatus according to the first embodiment.

In step ST1, the placement means 1 reads out the net list 11 and the library 12 from the storage means 4. The layout of an electronic circuit is determined by the placement means 1 based on the nest list 11 and the library 12 and the data related thereto is supplied to the cell duplicating and placement means 2. For-example, the layout of an electronic circuit as shown in FIG. 3 comprising an AND circuit 101 receiving two inputs 104 and 105, a wire 102 and a buffer 103 is determined.

In step ST2, the cell duplicating and placement means 2 receives the layout data of the electronic circuit and reads out the list 13 from the storage means 4. The cell duplicating and placement means duplicates cells for driving those wires specified in the list 13, connecting the duplicate cells parallel to the source cells for duplication and placing the duplicate cells. The cell duplicating and placement means 2 then supplies the layout data thus processed to the shield generating means 3. Referring to FIG. 3, AND circuits 111-1 and 111-2 provided by duplicating the AND circuit 101 are connected to parallel to the AND circuit 101 and placed appropriately.

In step ST3, the shield generating means 3, receiving the layout data processed by the cell duplicating and placement means 2, connects a shielding wire to each of the cells provided by the cell duplicating and placement means 2 and generates the shielding wires thus connected along the target wire subject to shielding. The shield generating means 3 stores the layout data thus processed in the storage means 4. Referring to FIG. 3, for example, shielding wires 112-1 and 112-2 are connected to the AND circuits 111-1 and 111-2 provided by duplication, respectively, and generated along the wire 102.

Second Embodiment

Figure 4:
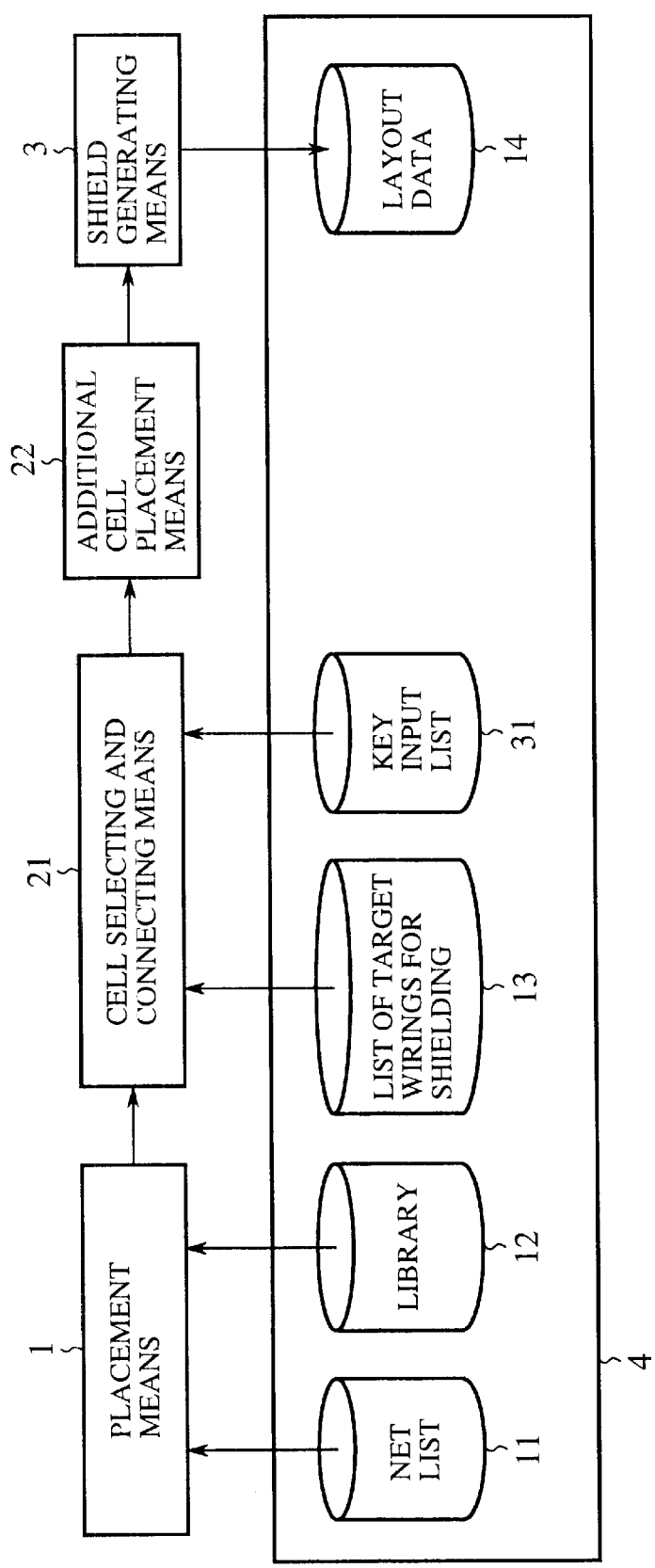
FIG. 4 is a block diagram showing a construction of a shield circuit designing apparatus according to a second embodiment of the present invention.

FIG. 4 is a block diagram showing a construction of a shield circuit designing apparatus according to a second embodiment of the present invention. Referring to FIG. 4, the shield circuit designing apparatus comprises a cell selecting and connecting means 21 for selecting a type of cell adapted to drive a shielding wire with a logical value corresponding to a logical value of at least one of the inputs to a cell that drives a target wire that require shielding, and for connecting cells of the selected type to the cell that drives the target wire. Reference numeral 22 indicates an additional cell placement means for placing the cells of the selected type selected by the cell selecting and connecting means 21.

Reference numeral 31 indicates a list provided for each target wire subject to shielding. The list 31 lists those inputs to the cell that drives the target wire which are material to the shielding through its variation in logical level.

Those components of FIG. 4 that are identical with-or equivalent to the corresponding components according to the first embodiment are designated by the same reference numerals and the description thereof is omitted.

A description will now be given of the operation according to the second embodiment.

Figure 5:
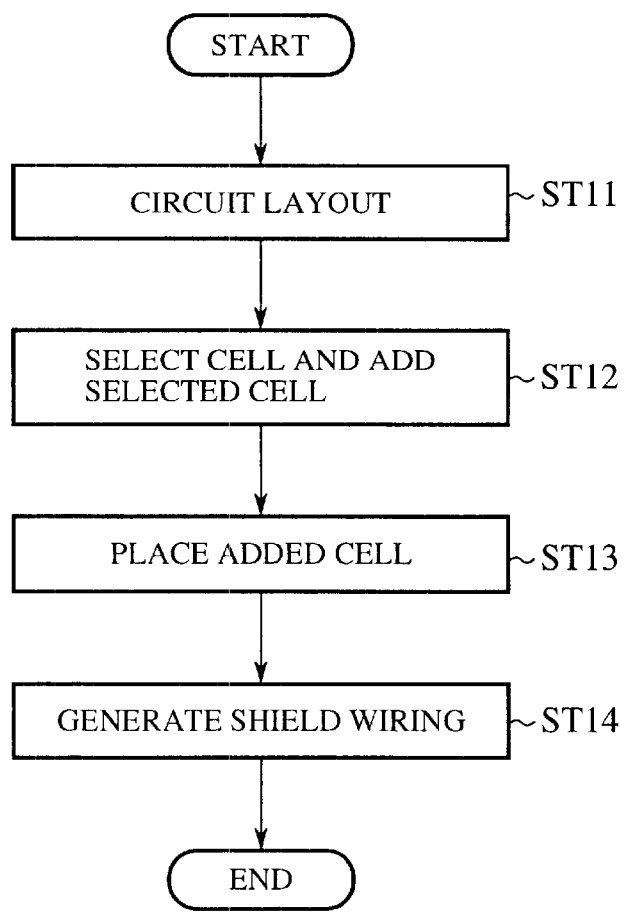
FIG. 5 is a flowchart showing an operation of the shield circuit designing apparatus according to the second embodiment.
Figure 6:
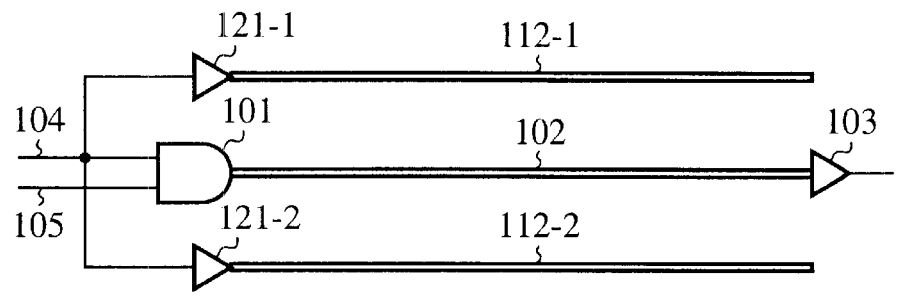
FIG. 6 is a circuit diagram of a shield circuit designed by the shield circuit designing apparatus according to the second embodiment.
Figure 7:
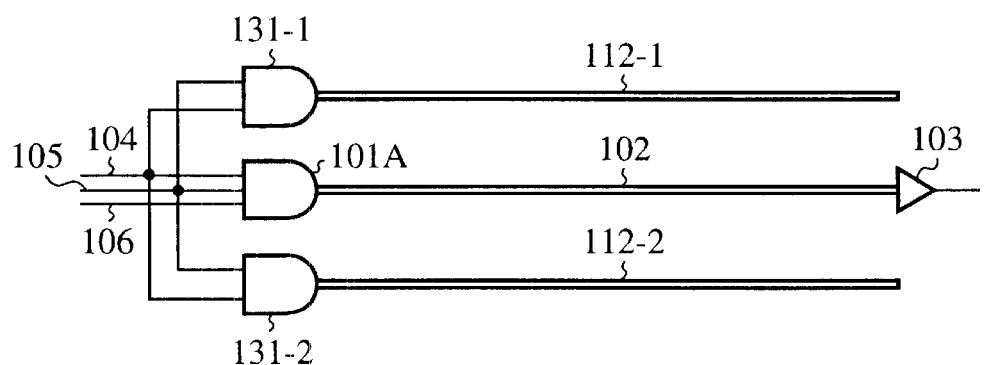
FIG. 7 is a circuit diagram of another shield circuit designed by the shield circuit designing apparatus according to the second embodiment.

FIG. 5 is a flow chart showing an operation of the shield circuit designing apparatus according to the second embodiment. FIG. 6 is a circuit diagram of a shield circuit designed by the shield circuit designing apparatus according to the second embodiment. FIG. 7 is a circuit diagram of another shield circuit designed by the-shield circuit designing apparatus according to the second embodiment.

In step ST11, the placement means 1 reads out the net list 11 and the library 12 from the storage means 4 and determines the layout of an electronic circuit based on the net list 11 and the library 12, supplies the layout data to: the cell selecting and connecting means 21. In the illustrated case of FIG. 6, the layout of an electronic circuit comprising the AND circuit 101 receiving the two inputs 104 and 105, the wire 102 and the buffer 103 is determined. In the case of FIG. 7, the layout of an electronic circuit comprising an AND circuit 101A receiving three inputs 104, 105 and 106, the wire 102 and the buffer 103 is determined.

In step ST12, the cell selecting and connecting means 21, receiving the layout data of the electronic circuit, reads out the list 13 and a key input list 31 from the storage means 4. The key input list 31 contains a list of selected inputs to a cell that drives a target wire specified in the list 13. The cell selecting and connecting means 21 selects a type of cell adapted to drive a shielding wire with a logical value corresponding to a logical value of the selected input. The cell selecting and connecting means 21 further connects cells of the selected type parallel to the cell that drives the target wire specified in the list 13. The cell selecting and connecting means 21 supplies the layout data thus processed to the additional cell placement means 22.

In the illustrated example of, FIG. 6, the wire 102 is a target wire that requires shielding. The AND circuit 101 for driving the target wire 102 receives the two inputs 104 and 105. The input 104 is assumed to be a key input. When the input 104 goes from logical 0 to logical 1, an output of the AND circuit 101 goes from logical 0 to logical 1 or remains logical 0. When the input 104 goes from logical 1 to logical 0, the output goes from logical 1 to logical 0 or remains logical 0. Accordingly, buffers 121-1 and 121-2 are selected to drive. shielding wires 112-1 and 112-2 in such a manner that the shielding wires 112-1 and 112-2 keep track of a variation in logical value occurring on the target wire 102 caused by a variation in logical value of the input 104. The buffers 112-1 and 112-2 are connected to the input 104 of the AND circuit 101.

In an alternative configuration, the cell for driving the target wire 102 is a two-input NAND circuit and the one of the two inputs is a key input. When the key input goes from logical 0 to logical 1, an output of the NAND circuit goes from logical 1 to logical 0 or remains logical 1. When the key input goes from logical 1 to logical 0, the output goes from logical 0 to logical 1 or remains logical 1. Accordingly, inverters (not shown) are selected to drive the shielding wires 112-1 and 112-2 in such a manner that the shielding wires 112-1 and 112-2 keep track of a variation in logical value occurring on the target wire 102 caused by a variation in logical value of the input 104. The inverters are connected to the input 104 of the NAND circuit.

Thus, when there is one key input, buffers or inverters are selected.

Referring to FIG. 7, the three-input AND circuit 101A drives the target wire 102 that requires shielding. The inputs 104 and 105 are assumed to be key inputs. When the input 104 or the input 105 goes from logical 0 to logical 1, an output of the AND circuit 101A goes from logical 0 to logical 1 or remains logical 0. When the input 104 or the input 105 goes from logical 1 to logical 0, the output goes from logical 1 to logical 0 or remains logical 0.

In this case, two-input AND circuits 131-1 and 131-2 are selected to drive shielding wires 112-1 and 112-2, respectively, to keep track of a variation in logical value occurring on the wire 102 caused by a variation in logical value of the inputs 104 and 105. The AND circuits 131-1 and 131-2 are connected to the inputs 104 and 105.

Thus, when there are two key inputs, two-input cells such as AND circuits are selected. Similarly, when there are n (n>2) key inputs, input cells are selected.

In step ST13, the additional cell placement means 22 places the cells selected by the cell selecting and connecting means 21 and supplies the layout data thus processed to the shield generating means 3.

Finally, in step ST14, the shield generating means 3, receiving the layout data thus processed, connects a shielding wire to each of the cells placed by the additional cell placement means 22 and generate the shielding wires thus connected along the target wire that requires shielding. The shield generating means 3 stores the layout data thus processed in the storage means 4. In the illustrated example of FIG. 6, the shielding wires 112-1 and 112-2 are connected to the added buffers 121-1 and 121-2, respectively, and generated along the wire 102. Referring to the example of FIG. 7, the shielding wires 112-1 and 112-2 are connected to the added AND circuits 131-1 and 131-2, respectively, and generated along the wire 102.

Thus, according to the second embodiment, the cell selecting and connecting means 21 selects a type of cell adapted to drive the shielding wire with a logical value corresponding to a logical value of at least one of the inputs to the cell that drives the target wire that requires shielding. The cell selecting and connecting means 21 further connects cells of the selected type to the cell that drives the target wire. The additional cell placement means 22 places the cells of the type selected by the cell selecting and connecting means 21. The shield generating means 3 generates the shielding wire connected to the cells of the selected type along the target wire. With this, construction, it is possible to design a small-scale shield circuit in which a delay in a variation in logical value occurring on the target wire, caused by a variation in logical value of at least one of the inputs to the cell that drives the target wire, is suppressed.

Third Embodiment

A shield circuit designing apparatus according to a third embodiment of the present invention is constructed such that the cell selecting and connecting means 21 connects a first cell that drives a first shielding wire and a second circuit that drives a second shielding wire in series. The shield generating means 3 generates the first shielding wire and the second shielding wire along the target wire that requires shielding. Those components of the shield circuit designing apparatus according to the third embodiment that are identical with or equivalent to the corresponding components according to the second embodiments are designated by the same reference numerals so that the description thereof is omitted.

A description will now be given of the operation according to the third embodiment.

Figure 8:
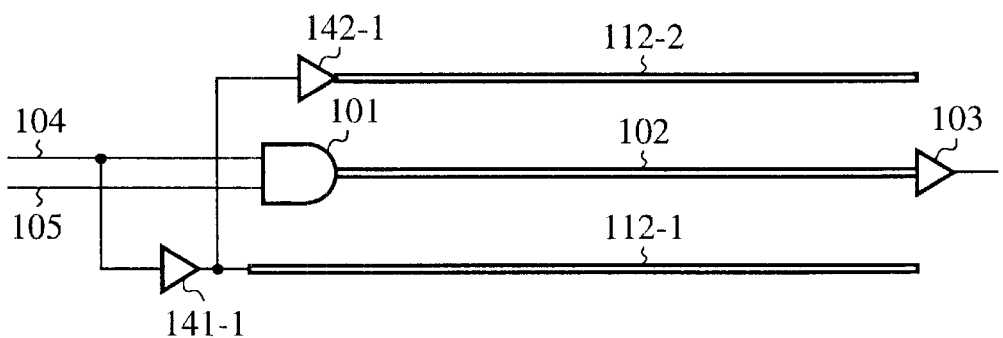
FIG. 8 is a circuit diagram of a shield. circuit designed by a shield circuit designing apparatus according to a third embodiment of the present invention.

FIG. 8 is a circuit diagram of a shield circuit designed by the shield circuit designing apparatus according to the third embodiment.

According to the third embodiment, the cell selecting and connecting means 21,receiving the layout data of the electronic circuit, reads out the list 13 ad the list 31 from the storage means 4. The cell selecting and connecting means 21 selects a first cell type of a first cell which cell type is adapted to drive a target wire specified in the list 13 with a logical value corresponding to a logical value of an input to the cell that drives the target wire and specified in the list 31. Also selected by the cell selecting and connecting means 21 is a second cell type of a second cell which cell type is adapted to drive a target wire specified in the list 13 with a logical value corresponding to a logical value of an input to the cell that drives the target wire and specified in the list 31. The cell selecting and connecting means 21 then connects the first and second cells in series.

In the illustrated example of FIG. 8, the AND circuits 101 with two inputs 104 and 105 is a cell that drives the target wire 102 that requires shielding. Assuming that the input 104 is a key input, buffers 141-1 and 142-1 are selected, as in the second embodiment illustrated in FIG. 6, as cells that drive the shielding wires 112-1 and 112-2, respectively. The buffer 141-1 is connected to the input 104 and the buffer 142-1 is connected to the buffer 141-1 in series.

Subsequently, the additional cell placement means 22 places the cells thus. connected. The shield generating means 3 generates a first shielding wire and a second shielding wire along the target wire.

The other aspects of the operation are the same. as the corresponding aspects of the second embodiment so that the description thereof is omitted.

Thus, according to the third embodiment, the cell selecting and connecting means 2.1 connects in series the first cell that drives the first shielding wire and the second cell that drives the second shielding-wire. The shield generating means 3 generates the first shielding wire and the second shielding wire along the target wire. With this construction, capacitance with respect to a terminal connected to a key input is reduced so that the shield circuit in which a delay in signal propagation is reduced is designed efficiently.

Fourth Embodiment

A shield circuit designing apparatus according to a fourth embodiment is constructed such that the cell selecting and connecting means 21 connects a cell that drives a first individual shielding wire parallel to a cell that drives a second individual shielding wire. The shield generating means 3 generates the first and second individual shielding wires, which constitute a shielding wire, along the target wire that requires shielding. Those components of the shield circuit designing apparatus according to the fourth embodiment that are identical with or equivalent to the corresponding components according to the second and third embodiments are designated by the same reference numerals so that the description thereof is omitted.

A description will now be given of the operation according to the fourth embodiment.

Figure 9:
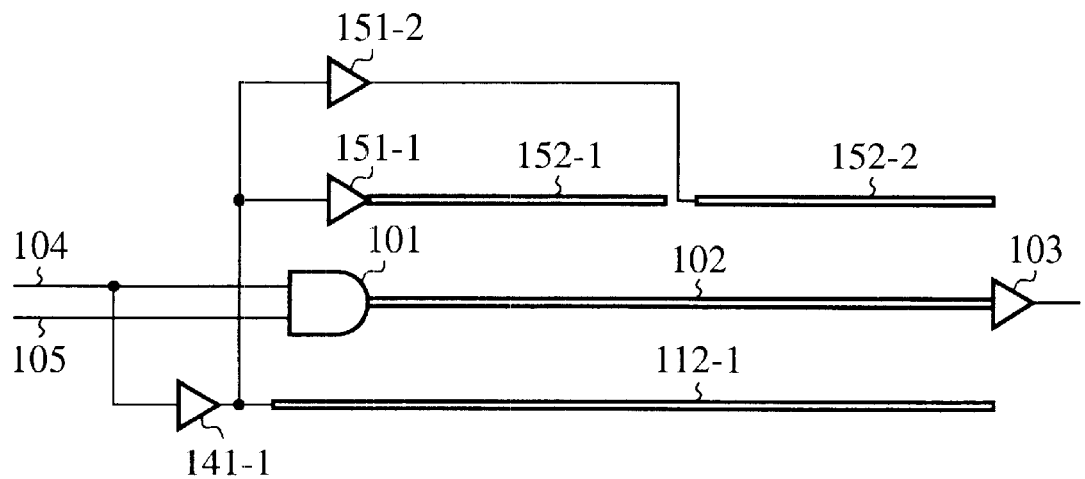
FIG. 9 is a circuit diagram of a shield circuit designed by a shield circuit designing apparatus according to a fourth embodiment of the present invention.

FIG. 9 is a circuit diagram showing a shield circuit designed by the shield circuit designing apparatus according to the fourth embodiment.

According to the fourth embodiment, the cell. selecting and connecting means 21 selects types of cells adapted to drive the first and second individual shielding wires and connects the cells of the selected types parallel to each other. The additional cell placement means 22 places the cells thus connected. The shield generating means 3 connects the first and second wires to the respective cells thus placed and generates these wires in series along the target wire that requires shielding.

In the illustrated example of FIG. 9, the AND circuits 101 with two inputs 104 and 105 is a cell that drives the target wire 102 that requires shielding. Assuming that the input 104 is a key input, buffers 151-1 and 151-2 are selected as cells that drive individual shielding wires 152-1 and 152-2, respectively. The buffers 151-1 and 151-2 are connected to the buffer 141-1 in series. The wires 152-1 and 152-2 are generated in series along the target wire 102 so as to constitute the shielding wire.

As has been described, according to the fourth embodiment, the cell selecting and connecting means 21 connects a first cell for driving a first individual shielding wire parallel to a second cell for driving a second individual shielding wire. The shield generating means 3 generates the first shield individual wire and the second individual shield wring, which constitute the shielding wire, along the target wire that requires shielding. The fourth embodiment facilitates the design of a shield circuit, in which capacitance in unit shielding wire connected to a corresponding one of driving cells (in the example of FIG. 9, buffers 151-1 and 151-2) is reduced.

Fifth Embodiment

A shield circuit designing apparatus according to the fifth embodiment is constructed such that the cell for driving the shielding wire placed by the cell duplicating and placement means 2 has a lower driving capability than the cell that drives the target wire that requires shielding. A low driving capability is defined as narrow channel width, large channel length, large (channel length/channel width) ratio of a transistor constituting the cell.

Those components of the shield circuit designing apparatus according to the fifth embodiment that are identical with or equivalent to the corresponding components of the first embodiment are designated by the same reference numerals so that the description thereof is omitted.

A description will now be given of the operation according to the fifth embodiment.

Figure 10:
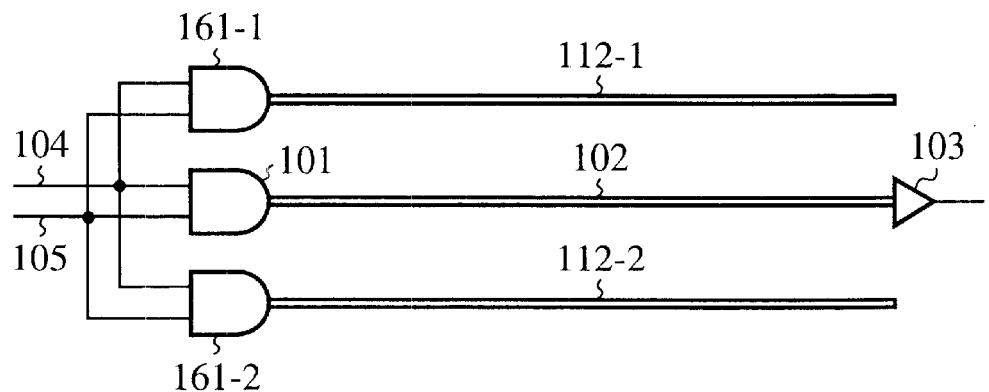
FIG. 10 is a circuit diagram of a shield circuit designed by a shield circuit designing apparatus according to a fifth embodiment of the present invention.

FIG. 10 is a circuit diagram of shield circuit designed by a shield circuit designing apparatus according to a fifth embodiment of the present invention.

According to the fifth embodiment, the cell placed by the cell duplicating and placement means 2 has a lower driving capability than and the same cell type as the cell that drives the target wire that requires shielding. In the illustrated example of FIG. 10, AND circuits 161-1 and 161-2 for driving the shielding wires 112-1 and 112-2, respectively, have lower driving capability than the AND circuit 101.

In the above description of the fifth embodiment, the cell duplicating and placement means 2 is used to provide by duplication the cell having the same cell type as and a lower driving than capability than the cell that drives the target wire. An alternative construction is that the cell selecting and connecting means 21 according to the second through fourth embodiments is used to do the same.

As has been described, according to the fifth embodiment, the cell for driving the shielding wire is configured as a cell having a comparatively low driving capability. With this construction, the shield circuit, in which the power consumption is reduced and the shielding wire is prevented from affecting the other wires, is efficiently designed.

The present invention is not limited to the above-described embodiments, and variations and modifications may be made without departing from the scope of the present invention.

What is claimed is:

1. A shield circuit designing apparatus for designing a shield circuit for shielding a target wire that requires shielding;

cell duplicating and placement means for duplicating a cell that drives the target wire, and for placing duplicate cells; and shield generating means for generating shielding wires connected to the duplicate cells placed by said cell duplicating and placement means, along the target wire.

2. The shield circuit designing apparatus according to claim 1, wherein said cell duplicating and placement means places the cells having a lower driving capability than the cell that drives the target wire.

3. A shield circuit designing apparatus for designing a shield circuit for shielding a target wire that requires shielding, comprising:

cell selecting and connecting means for selecting a type of cell adapted to drive shielding wires with a logical value corresponding to a logical value of at least one of inputs to a cell that drives the target wire, and for connecting cells of the selected type to the cell that drives the target wire;

additional cell placement means for placing the cells connected by said cell selecting and connecting means; and shield generating means for generating the shielding wires connected to the cells connected by said cell selecting and connecting means, along the target wire.

4. The shield circuit designing apparatus according to claim 3, wherein said cell selecting and connecting means selects one of an inverter and a buffer.

5. The shield circuit designing apparatus according to claim 3, wherein said cell selecting and connecting means connects a first cell for driving a first shielding wire and a second cell for driving a second shielding wire in series, and said shield generating means generates the first and second shielding wires along the target wire.

6. The shield circuit designing apparatus according to claim 3, wherein said cell selecting and connecting means connects a first cell for driving a first individual shielding wire parallel to a second cell for driving a second individual shielding wire, the first and second individual wring constituting the shielding wire, and said shield generating means generates the first and second individual wires along the target wire.

7. The shield circuit designing apparatus according to claim 3, wherein said cell selecting and connecting means selects a type of cell having a lower driving capability than the cell that drives the target wire.

8. A shield circuit designing method for designing a shield circuit for shielding a target wire that requires shielding, comprising the steps of:

duplicating a cell that drives a target wire and placing resultant duplicate cells to drive respective shielding wires; and generating the shielding wires connected to the duplicate cells along the target wire.

9. The shield circuit designing method according to claim 8, wherein the cells that drive the shielding wires have a lower driving capability than the cell that drives the target wire.

10. A shield circuit designing method for designing a shield circuit for shielding a wire, comprising the steps of:

selecting a type of cell adapted to drive shielding wires with a logical value corresponding to a logical value of at least one of inputs to a cell that drives the target wire, and connecting cells of the selected type to the cell that drives the target wire; and placing the cells thus connected; and generating the shielding wires connected to the cells thus connected, along the target wire.

11. The shield circuit designing method according to claim 10, wherein one of an, inverter and a buffer is selected as the type of cell for driving the shielding wires.

12. The shield circuit designing method according to claim 10, wherein a first cell of the selected type for driving a first shielding wire and a second cell of the selected type for driving a second shielding wire are connected in series, and the first and second shielding wires are generated along the target wire.

13. The shield circuit designing method according to claim 10, wherein a first cell for driving a first individual shielding wire is connected parallel to a second cell for driving a second individual shielding wire, the first and second individual wrings constituting the shielding wire, and the first and second individual wires are generated along the target wire.

14. The shield circuit designing method according to claim 10, wherein the cells that drive the shielding wires have a lower driving capability than the cell that drives the target wire.

* * * * *